United States Patent [19]

Ermilov et al.

[11] Patent Number: 5,016,088
[45] Date of Patent: May 14, 1991

[54] UNIT OF SEMICONDUCTOR ELEMENTS

[75] Inventors: Igor V. Ermilov, Reutov; Jury I. Matusov; Evgeny V. Mescheryakov, both of Moscow, all of U.S.S.R.

[73] Assignee: Institut Imeni V. I. Lenina, Moscow, U.S.S.R.

[21] Appl. No.: 430,872

[22] Filed: Nov. 2, 1989

[51] Int. Cl.$^5$ ............................................. H01L 23/32
[52] U.S. Cl. ........................................ 357/76; 357/82; 357/77
[58] Field of Search .................... 357/82, 68, 79, 76, 357/77, 74

[56] References Cited

U.S. PATENT DOCUMENTS

| | | | |
|---|---|---|---|
| 2,981,873 | 4/1961 | Eannarino | 357/76 |
| 3,753,052 | 8/1973 | Rosser | 317/234 |
| 4,153,910 | 5/1979 | Itoh | 357/68 |
| 4,301,465 | 11/1981 | Masselin | 357/82 |

FOREIGN PATENT DOCUMENTS 2477775 9/1981 France .

Primary Examiner—Andrew J. James
Assistant Examiner—Reginald Ratliff
Attorney, Agent, or Firm—Lilling & Lilling

[57] ABSTRACT

A unit of series-connected semiconductor elements includes a cylindrical metal case with a clamping mechanism enclosed therein. A chain of semiconductor elements is arranged between the surfaces of clamping elements of the clamping mechanism coaxially with the case. One extreme semiconductor element of the chain contacts the bottom of the case made of a current-conducting material, functioning as one clamping element of the clamping mechanism. The second extreme semiconductor element of the chain contacts the second clamping element of the clamping mechanism, made of an insulation material and mechanically coupled with the side walls of the case.

The unit also contains current-carrying busbars electrically associated with the outputs of the extreme semiconductor elements of the chain, one of the current-carrying busbars being electrically connected with the upper part of the side wall of the case.

1 Claim, 2 Drawing Sheets

UNIT OF SEMICONDUCTOR ELEMENTS

BACKGROUND OF THE INVENTION

1. Field of the Invention

The present invention relates to electrical engineering and, more precisely, to units of semiconductor elements.

The present invention may be applied in power supply circuits of electrical installations in matching several power supply sources differing in voltage and connected to the same load.

2. Description of the Related Art

When supplying power to electrical installations requiring current pulses with the maximum current strength of 100 to 300 kA and power of $10^9$ to $10^{11}$ W at a high switching frequency in low-inductance circuits the prior art units of semiconductor elements do not ensure sufficient operational reliability due to mutual induction effect with the units working simultaneously.

Widely known in the art is a unit of series-connected semiconductor elements (cf., P, Fr, No. 2,477,775), comprising a cylindrical metal case with a chain of pellet semiconductor elements enclosed therein. The chain of pellet semiconductor elements includes two sections, arranged parallel to each other. Copper inserts are located between the adjoining flat surfaces of the pellet semiconductor elements. The ends of the sections of the semiconductor element chain bear against plates functioning as clamping elements of a clamping mechanism. The clamping mechanism also contains a load-bearing element made in the form of a stud taking up the semiconductor element clamping effort, and located coaxially with the metal case. The sections of the semiconductor element chain are disposed symmetrically on both sides of the load-bearing element of the clamping mechanism. Current-carrying busbars connected ot the power supply source are associated with the outputs of the extreme semiconductor elements. Symmetric arrangement of the sections of semiconductor elements relative to the axis of the metal case produces a reverse current in the sections, which compensates the magnetic field outside the case and relieves the metal case of the action of electrodynamic forces. Due to asymmetric arrangement of the sections in a longitudinal section the compensation of the magnetic field outside the metal case is non-uniform; the compensation is minimal in the direction perpendicular to the plane containing the sections of the semiconductor element chain, which results in mutual induction effect of simultaneously operating units of semiconductor elements, worse uniformity of electric current distribution across the sections of the chain and worse relief of the case of the action of electrodynamic forces. The foregoing factors bring about lower reliability of the unit of semiconductor elements and its power capacity, and the permissible value of the pulsating current.

SUMMARY OF THE INVENTION

The present invention aims at providing a unit of semiconductor elements with such geometric arrangement of the chain of semiconductor elements in the case and such a design of the clamping elements in the clamping mechanism, which would make it possible to enhance the operational reliability of the unit of semiconductor elements.

An object of the present invention is to enhance the operational reliability of the unit of semiconductor elements.

The aims of the invention are accomplished by providing a unit of series-connected semiconductor elements, comprising a cylindrical metal case enclosing a clamping mechanism. Arranged between the surfaces of the clamping elements is a chain of semiconductor elements made in the form of pellets whose end surfaces adjoin each other. Current carrying busbars electrically associated with the outputs of the extreme elements of the chain. According to the invention, the chain of semiconductor elements is arranged coaxially with the case, one extreme semiconductor element of the chain contacts the bottom of the case, made of a current-conducting material, functioning as one clamping element of the clamping mechanism, and the second extreme semiconductor element of the chain contacts the second clamping element of the clamping mechanism, made of an insulation material and mechanically coupled with the side walls of the case. One of the current-carrying busbars is electrically associated with the upper part of the side wall of the case.

Use of the present invention allows mutual effect of simultaneously operating units of semiconductor elements to be overcome, as the bottom and the side wall of the case are electrically associated with the current-carrying busbar. With the equal number of semiconductor elements, it is practicable to reduce the volume of the case in a unit of semiconductor elements, for the functions of the load-bearing element of the clamping mechanism are discharged by the side wall of the case.

BRIEF DESCRIPTION OF THE DRAWINGS

The invention will now be explained by a detailed description of a unit of semiconductor elements and a specific embodiment thereof taken in conjunction with the accompanying drawings, wherein.

DESCRIPTION OF THE PREFERRED EMBODIMENT

Figure 1:
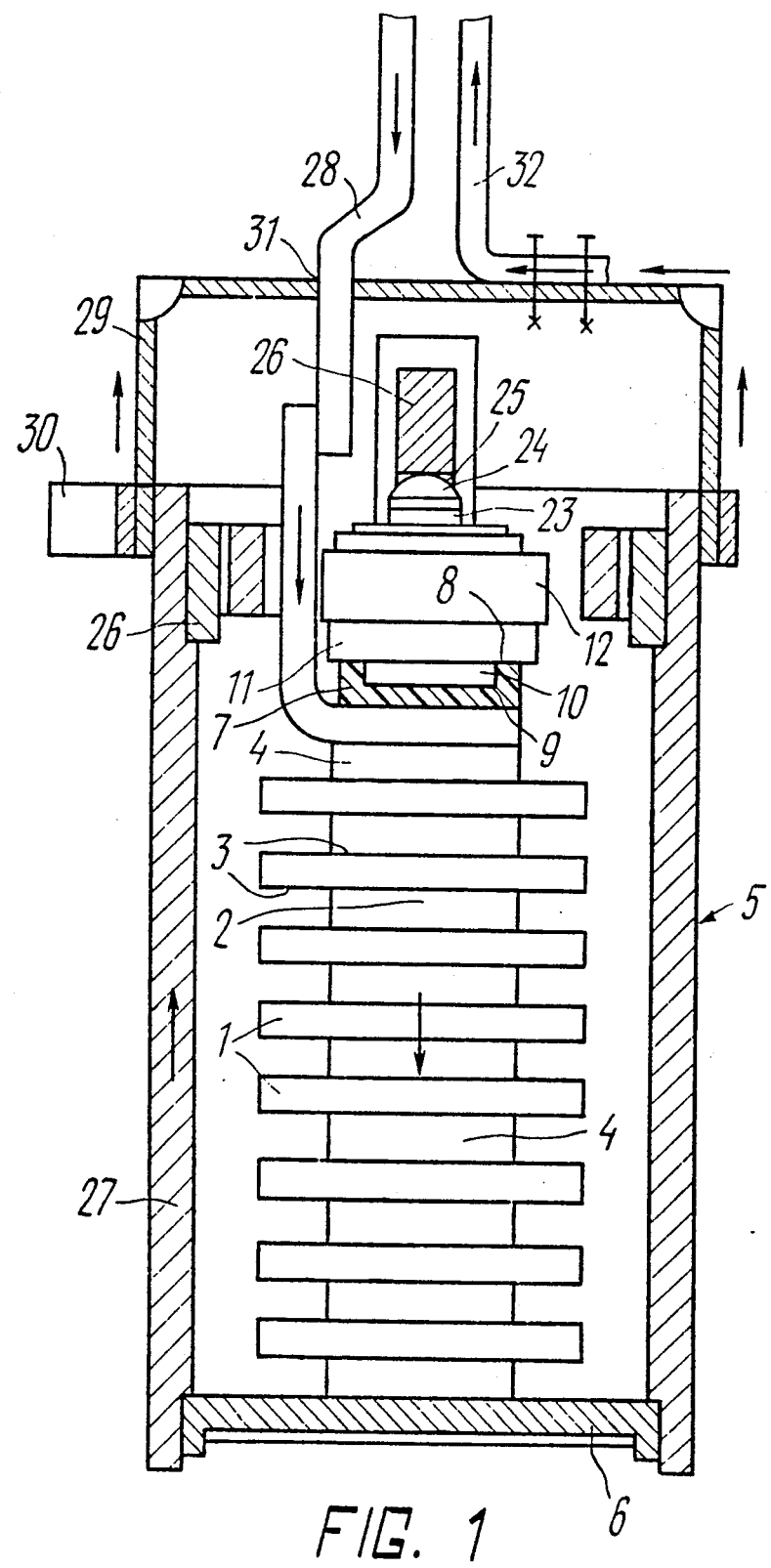
FIG. 1 illustrates a general view of a unit of semiconductor elements (longitudinal section), according to the invention.

A unit of semiconductor elements comprises semiconductor elements, e.g. diodes 1 (FIG. 1) connected in series. The semiconductor diodes 1 are made in the form of a pellet.

A unit of semiconductor elements may be made up of, for instance, thyristors.

The semiconductor diodes 1 are located on an axis 2, their end surfaces 3 adjoining each other. Each of the semiconductor diodes 1 is arranged between copper inserts 4 intended for power supply and cooling of the semiconductor diodes 1.

In another version of a unit of semiconductor elements with the end surfaces of the pellet semiconductor diodes 1 adjoining each other, a chain of the semiconductor diodes 1 is enclosed in a metal cylindrical case coaxially therewith. The case 5 houses a clamping mechanism, with the chain of semiconductor diodes 1 arranged between its clamping elements 6 and 7.

One extreme semiconductor diode 1 of the chain contacts, via a copper insert 4, the bottom of the case 5, made of a current-conducting material and functioning as a first clamping element 6 of the clamping mechanism. The second extreme semiconductor diode 1 of the chain contacts, through the copper insert 4, a second clamping element 7 of the clamping mechanism, made in the form of a cylindrical washer of an insulating material.

Figure 2:
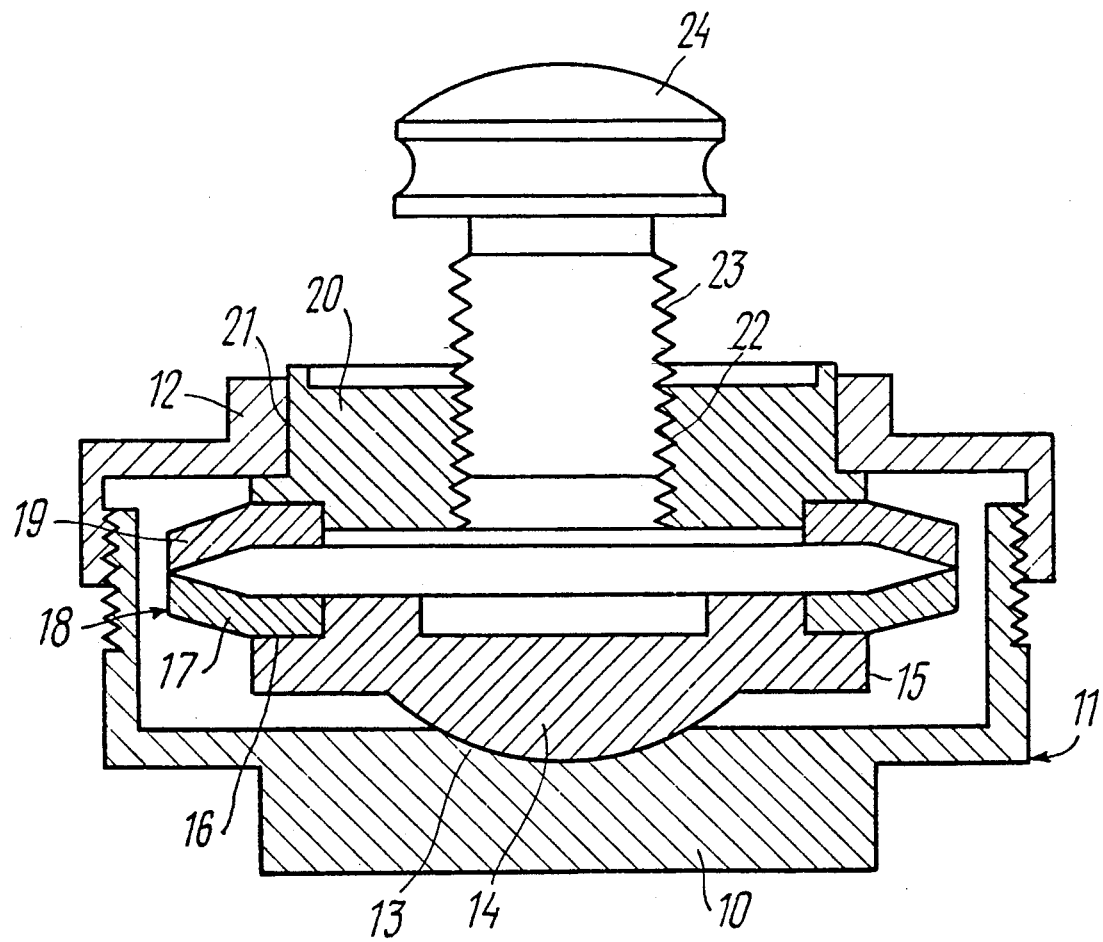
FIG. 2 is a joint of a clamping element of a cla126 to the invention.

An upper end 8 of the second clamping element 7 has a slot 9 to receive a projection 10 of a base 11. A cover 12 is screwed on the upper part of the side wall of the base 11. The inner space of the base 11 (FIG. 2) has a spherical recess 13 enclosing a spherical projection 14 of a support 15. The upper surface of the support 15 carries a slot 16 made on its outer diameter to receive a lower ring 17 of a disk spring 18.

A bushing 20 rests upon an upper ring 19 of the disk spring 18. The bushing 20 is inserted in a hole 21 of the cover 12 of the base 11. A central hole 22 in the bushing 20 encloses a screw 23 with a spherical head 24 thereof fitting a recess 25 (FIG. 1) of a cross-piece 26. The cross-piece 26 is screwed, along its outer diameter, on the upper part of a side wall 27 of the case 5.

The unit also contains a current-carrying busbar 28 (FIG. 1), with one end thereof clamped between the second clamping element 7 of the clamping mechanism and the copper insert 4 contacting the uppermost semiconductor diode 1 of the chain. A cylindrical cover 29 is rigidly secured to the upper part of the side wall 27 of the case 5 with the aid of a clamp 30. The end wall of the cover 29 has a hole 31 for the outlet of the current-carrying busbar 28.

One end of a current-carrying busbar 32 is secured on the side wall of the cover 29. The current-carrying busbars 28 and 32 are connected to the elements of the power supply circuit (omitted in the drawing).

The unit of semiconductor elements operates as follows.

The chain of the semiconductor diodes 1 (FIG. 1) is tightened with the clamping elements 6 and 7 of the clamping mechanism to produce the requisite compression effort adopted for the given type of the semiconductor diodes 1.

The mechanical effort is successively imparted to the bushing 20 (FIG. 2), the disk spring 18 which, while compressed, imparts the compression effort to the support 15, the base 11 and the clamping element 7 (FIG. 1) of the clamping mechanism. To locate the compression effort for the semiconductor diodes 1, the screw 23 is turned out till it thrusts against the recess 25 of the cross-piece 26.

As the unit of semiconductor diodes is energized in accordance with the polarity of the semiconductor diodes 1, a reverse electric current starts flowing through the chain of the semiconductor diodes 1 and the side wall 27 of the case 5; as a result the magnetic field concentrates inside the case 5.

Absence of a magnetic field outside the unit of semiconductor elements precludes mutual effect of the units operating simultaneously, which makes it possible to compose a rectifier with the requisite capacity of individual units without the use of special current equalizers. The unit of semiconductor elements is mechanically balanced against the action of electrodynamic forces, as a result of which the maximum permissible pulsating current determined by the parameters of the semiconductor diodes increases.

What is claimed is:

1. A unit of series-connected semiconductor elements, comprising:
    a cylindrical metal case having a bottom and side walls;
    a clamping mechanism;
    a first clamping element of said clamping mechanism, whose functions are discharged by said bottom of said case made of a current-conducting material;
    a second clamping element of said clamping mechanism, made of an insulation material, electrically insulated from said case and mechanically coupled with said side walls of said case;
    a chain of said semiconductor elements arranged coaxially with said case, said semiconductor elements of said chain being made in the form of a pellet, and having end surfaces which adjoin each other;
    a first extreme semiconductor element of said chain, contacting said bottom of said case which functions as said first clamping element of said clamping mechanism;
    a second extreme semiconductor element of said chain, contacting said second clamping element of said clamping mechanism;
    a first current-carrying busbar electrically associated with the upper part of said side wall of said case;
    a second current-carrying busbar electrically associated with the output of said second extreme semiconductor element of said chain, so that when an electric current is applied to said unit, said current will flow in a first direction through said semiconductor elements, and will flow in a second direction through said case, and said second direction is opposite to said first direction.

* * * * *